US005434535A

United States Patent [19]

Tomasini et al.

[11] Patent Number: 5,434,535

[45] Date of Patent: Jul. 18, 1995

[54] RC FILTER FOR LOW AND VERY LOW FREQUENCY APPLICATIONS

[75] Inventors: Luciano Tomasini, Monza; Rinaldo Castello, Arcore, both of Italy

[73] Assignee: S.G.S Thomson Microelectronics S.R.L., Milan, Italy

[21] Appl. No.: 97,067

[22] Filed: Jul. 23, 1993

[30] Foreign Application Priority Data

Jul. 29, 1992 [EP] European Pat. Off. ........... 92830422

[51] Int. Cl.[6] .............................................. H03H 11/46

[52] U.S. Cl. .................................... 327/552; 327/558; 333/172

[58] Field of Search ........................ 307/520, 521, 494; 328/167; 330/109, 107, 254, 300, 301; 333/172, 173

[56] References Cited

U.S. PATENT DOCUMENTS

| | | | |
|---|---|---|---|
| T904,030 | 11/1972 | Davie | 307/520 |
| 3,786,363 | 1/1974 | Lelie | 328/162 |
| 3,805,178 | 4/1974 | Rollett | 330/109 |
| 3,938,394 | 2/1976 | Morrow et al. | 73/462 |
| 4,035,733 | 7/1977 | Morrow et al. | 328/34 |
| 4,044,310 | 8/1977 | Morrow et al. | 328/27 |
| 4,112,382 | 9/1978 | Morrow et al. | 328/181 |
| 4,241,314 | 12/1980 | Iwamatsu | 330/300 |
| 4,767,998 | 8/1988 | Delagrange | 330/109 |
| 4,783,635 | 11/1988 | Sedastopoulos | 307/520 |
| 4,984,207 | 1/1991 | Takeno et al. | 302/530 |
| 5,089,789 | 2/1992 | Van Tran | 330/300 |
| 5,168,180 | 12/1992 | Bayer et al. | 302/520 |
| 5,241,226 | 8/1993 | Rossi et al. | 307/520 |

FOREIGN PATENT DOCUMENTS 0274784 7/1988 European Pat. Off. .

*Primary Examiner*—Timothy P. Callahan
*Assistant Examiner*—Dinh Le
*Attorney, Agent, or Firm*—Seed and Berry

[57] ABSTRACT

An RC filter for low or very low frequency applications, comprising a resistor between the filter input and output, and an amplifier connected after the resistor and having an output fed back to the amplifier input through a capacitor. This simple design allows the known Miller Effect to be utilized to produce a filter having a high time constant while employing small-size components which occupy little space in integrated circuits.

19 Claims, 2 Drawing Sheets

RC FILTER FOR LOW AND VERY LOW FREQUENCY APPLICATIONS

TECHNICAL FIELD

This invention relates to an RC filter for low or very low frequency applications.

BACKGROUND OF THE INVENTION

The field of application of the invention relates in particular, but not exclusively, to telephone speech circuits incorporated to telephone subscriber bets. Reference will be made in this description to that field of application for simplicity of illustration.

Specifically in that field of application, there exists a demand for RC filters operating at a low or very low frequency. Further, frequently associated with this demand is the need to achieve very high time constants, e.g. on the order of a fraction of a second. Exemplary of this are those instances where a DC reference voltage requires to be separated from the telephone signal being received in said speech circuits.

As is known, a very high time constant requires that very large capacitors and/or resistors be also used.

This is not much of a problem where discrete component circuits are involved, because capacitors on the order of hundreds of microfarads and resistors on the order of tens of Megaohms are readily available commercially.

However, where such components are to be implemented in an integrated circuit, serious problems arise in terms of the silicon area to be reserved for the RC circuit.

The prior art has been proposing the use of discrete components connected externally of the integrated circuit. This is the approach that has been followed heretofore for telephone speech circuits as well.

But this prior approach tends to make the manufacturing process of each silicon chip, and hence each circuit, more expensive. Additionally, prior solutions have proved low in accuracy.

The underlying technical problem of this invention is to provide an RC filter which has such structural and operational features as to suit integrated circuits requiring very high time constants and overcome the limitations which beset prior art embodiments.

SUMMARY OF THE INVENTION

The present invention is embodied in a filter circuit having input and output terminals with a resistor coupled therebetween. An amplifier having an amplifier input terminal is coupled to the filter output terminal to provide gain. A capacitor is coupled between an amplifier output terminal and the filter output terminal.

In one embodiment, the amplifier is a transistor. Alternatively, the amplifier may be an operational amplifier whose inverting input is the amplifier input terminal. The non-inverting terminal is coupled to the circuit ground.

The features and advantages of a filter according to the invention will become apparent from the following detailed description of an embodiment thereof, given by way of non-limitative example with reference to the accompanying drawings.

DETAILED DESCRIPTION OF THE INVENTION

Figure 1:
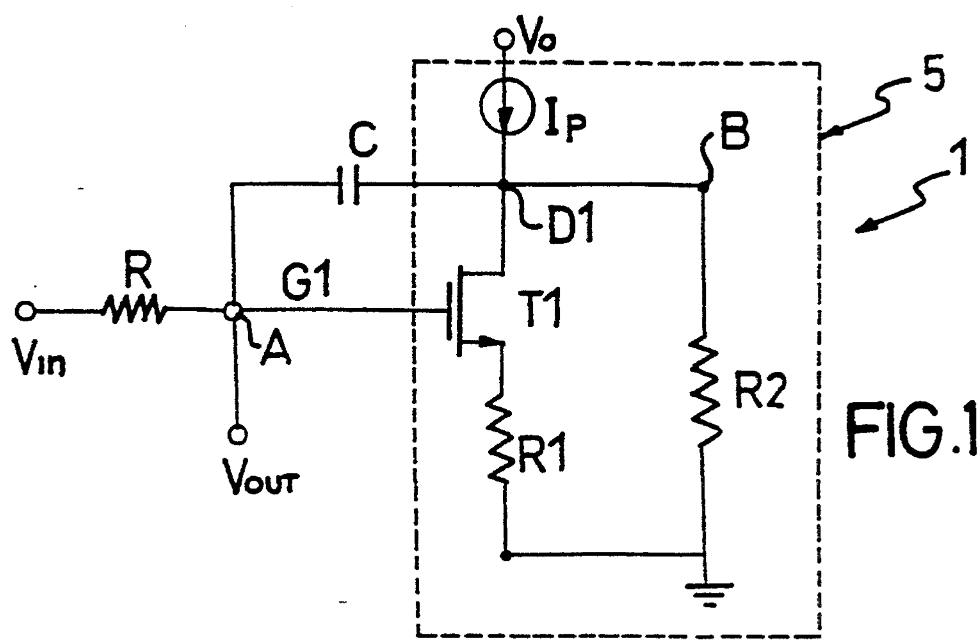
FIG. 1 is a diagram of an RC filter embodying this invention.

With reference to the drawing figures, generally and schematically shown at 1 is an RC filter embodying this invention and being adapted for low or very low frequency applications.

The filter 1 comprises a resistor R between an input terminal Vin and an output terminal Vout. Also provided therein is an amplifier 5 connected after the resistor R and having an output B fed back to the input A through a capacitor C.

This amplifier 5 is implemented by a transistor T1 of the n-channel MOS type which has a gate terminal G1 constituting the input A. This transistor T1 has its source S1 connected to ground via a resistor R1, and its drain D1 also connected to ground via a second transistor R2.

The drain D1 is the output node B, and is also connected to a voltage supply Vs through a bias current generator Ip.

The amplification gain k of the filter 1 is made intentionally small and lower than 10.

This gain is nearly equal to the ratio of resistors R2 and R1, if the transconductance value gm of the MOS transistor T1 is taken high relatively to such resistors. That is, the product gm*R1 should be much larger than unity.

The above-described circuit is characterized by low noise in the telephone band in which integrated speech circuits are usually required to operate.

In fact, the filter pole that separates the DC reference signal from the AC signal is on the order of a few Hertz so as not to affect the synthesis by the impedance associated with the integrated telephone circuit and the telephone band transmission gain.

Since noise may be more important in the telephone band of interest—i.e. the band in the 1 to 2 kHz range, as may be obtained through a filter—the circuit of this invention is operated within that band in a fully equivalent manner to a low-pass filter comprising a resistor R and a capacitor having a value of $(|k|+1)*C$. It appears then as if the capacitance had been multiplied and the noise proportionally reduced.

Figure 2:
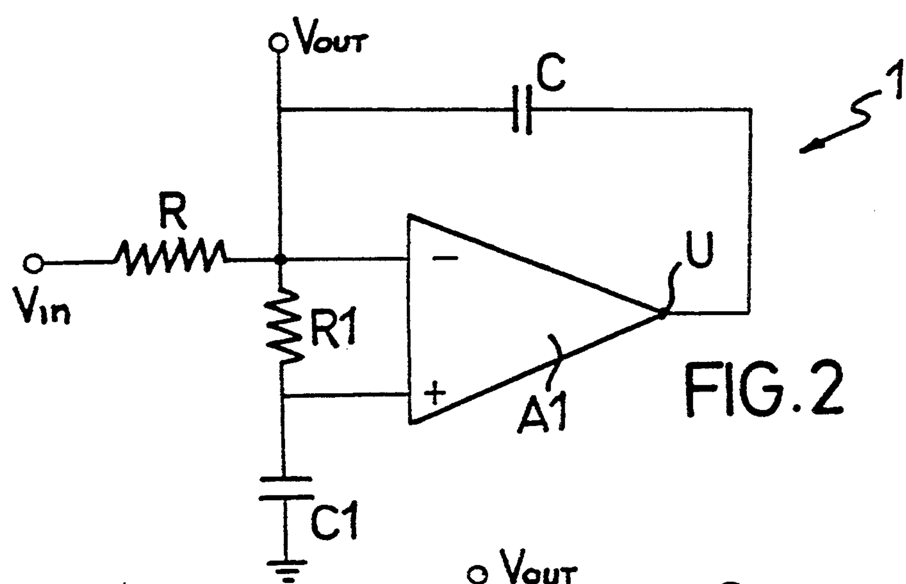
FIG. 2 is a diagram of a variation of the inventive filter.

This also explains why the gain value k is kept small, that is, to avoid as far as feasible amplification of the DC component along with the AC signal component. This prevents clamping phenomena from occurring at the output node B. A development of the filter of this invention is shown in FIG. 2 which has a slightly more complicated circuit design.

The input signal Vin is applied to the inverting (−) input of an operational amplifier A1 through a resistor R. The inverting input also receives the output signal Vout as a feedback signal. This amplifier A1 is selected to have a high DC gain, preferably of 100.

The amplifier A1 has an output U fed back to the inverting (−) input through a capacitor C.

The other, non-inverting (+) input of the amplifier A1 is connected to the inverting (−) input via a resistor R1 and to ground via a capacitor C1.

Figure 3:
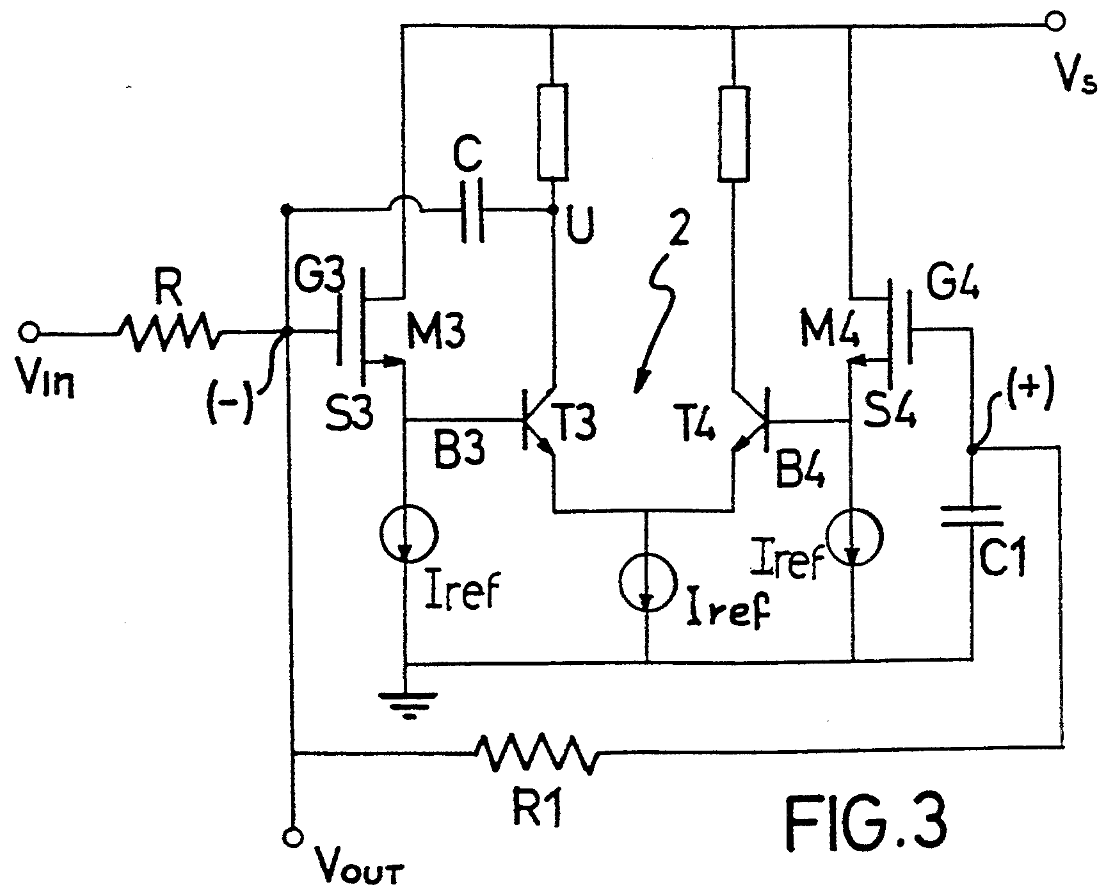
FIG. 3 is a detail representation of the embodiment shown in FIG. 2.

The amplifier A1 is implemented in FIG. 3 with a bipolar/MOS mixed technique with a differential cell 2 which includes common emitter transistors T3 and T4. The reference current Iref may be selected to provide a desired DC value at the output U.

The inverting (−) and non-inverting (+) inputs of the differential cell 2 are formed each of a corresponding one of n-channel MOS transistors M3 and M4, having respective sources S3 and S4 connected to the base terminals B3, B4 of their corresponding bipolar transistors in the differential cell 2. Such MOS transistors avoid the appearance of base current because they can be seen as infinite impedance inputs.

The resistor R1 locates between the gate terminals G3, G4 of the MOS transistor pair M3 and M4.

Figure 4:
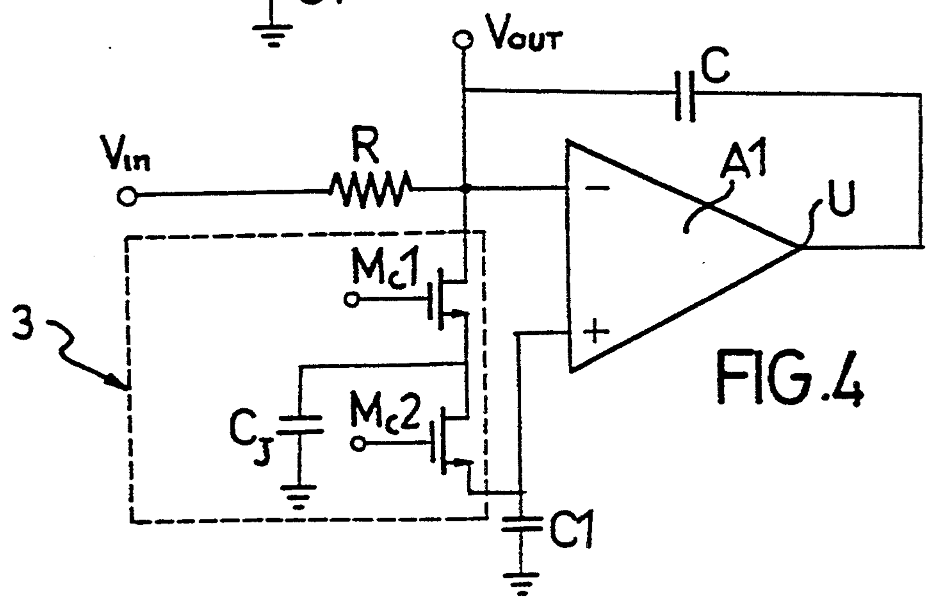
FIG. 4 shows in diagrammatic form a further embodiment of a filter according to the invention.

Alternatively, as shown in FIG. 4, between the inputs of amplifier A1 there may be connected a circuit 3 comprising a switched capacitor type of filter. The circuit 3 would be effective to change a capacitance Cj into an equivalent resistance.

Said circuit 3 comprises a pair of MOS transistors Mc1 and Mc2 connected together and across the inputs of amplifier A1. The drain of MOS transistor Mc1 is connected to the inverting input (−) of the amplifier A1. The source of MOS transistor Mc1 is coupled to the drain of MOS transistor Mc2 which, in turn, has its source coupled to the non-inverting input (+) of the amplifier A1. Between the MOS transistors Mc1 and Mc2 and ground, a capacitor Cj is also connected.

At a predetermined sampling frequency fc, the equivalent resistance of Cj is given as $1/(cj*fc)$, and can be made quite large. This allows a much higher resistance for R1 than R, and as a result, a time constant $Ri*C1$ which is much higher than the time constant $R*C$, even for the same capacitor values.

The operation of the RC filter of this invention will be now described.

The invention is based on a principle known as the Miller Effect, which can be defined as follows:

With a capacitance C across two circuit nodes wherebetween a negative gain G exists, the capacitance C is equivalent to a capacitance $C'=(|G|+1)*C$ connected between the first of said nodes and ground and having a value $|G|+1$ which is much larger than the former.

In other words, when a capacitor is connected between two nodes A and B across which a gain G exists, this is comparable to placing a $|G|+1$ times larger capacitor between the first node A and ground.

The utilization of this principle is quite apparent from the example of FIG. 1, whose structure is the equivalent of a resistor R connected between the filter input and output and associated with a capacitor C' with value $(|G|+1)*C$ connected between the filter output and ground.

On the other hand, the example of FIG. 2 has proved especially effective where the input signal Vin results from a DC component and an AC component.

The dominant pole of the circuit in FIG. 2 locates approximately at $1/[R*C*|G|+1)]$, and lies below the frequency range of the input signal.

Under such conditions, the low-pass filter formed of the resistor R1 and the capacitor C1 causes the DC signal between the two inputs of amplifier A1 to be null and, accordingly, not amplified.

With much higher frequencies than those of the pole represented by the $1/(Ri*C1)$ ratio, the non-inverting (+) input of amplifier A1 is clamped to ground, and by Miller Effect., the signal applied to the other, inverting input (−) is greatly reduced by the filtering action.

Here again, no saturation of the amplifier output occurs.

This variation of the filter 1 according to the invention is especially useful with telephone speech circuits because, despite the presence of a pole at frequencies on the order of some Hertz, it allows steady-state conditions to be attained in about a hundred milliseconds time after turning on the circuit.

Usually, in order to speed up this transition, special speed-up techniques must be resorted to, that is the filter band must be widened. Alternatively, the filter could be bypassed on turning on.

Now, the filter of this invention produces a speeding-up condition automatically in which, during the transition, the telephone circuit operates at a time constant which is set by the poles of the filter 1, which poles are not multiplied, however, by Miller Effect.

Figure 5:
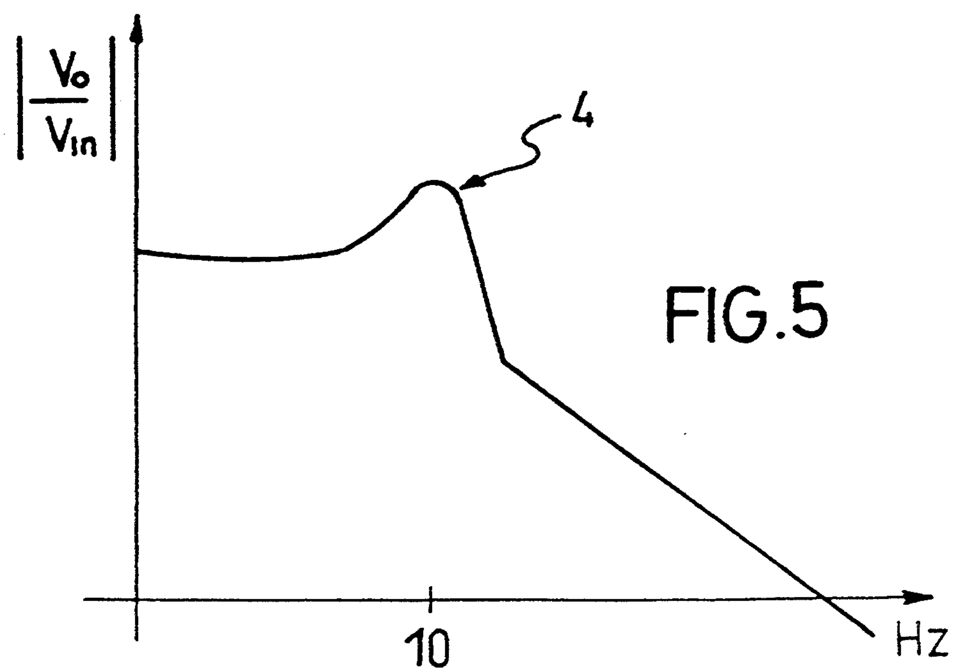
FIG. 5 is a plotting of the so-called frequency response of the inventive filter.

In fact, taking the DC gain of amplifier A1 as 100, the frequency response of the filter 1 is that shown in FIG. 5, wherein a peak 4 of about 10 dB is outstanding proximate the value of $1/(20*R*C)$.

Thus, on the amplifier input there will appear a signal at a frequency which is close to, or the same as, that of the dominant pole of appreciable amplitude.

However, amplification by 100 brings the output to a clamping state, whereby the amplifying effect of capacitor C ceases to exists. Consequently, the dominant pole will move to frequencies which are higher by about 100 units, and start-up time will decrease by a similar value.

This situation may be regarded for all purposes as the equivalent of automatic speeding up.

In some applications, the aforesaid peak 4 may be undesired, and to prevent it, the embodiment of FIG. 4 may be used which allows a much increased equivalent resistance of Cj switched to frequency fc; that is, $Req=1/(Cj*fc)$.

With this embodiment, the input signal Vin would not be sampled, thereby making the provision of an antialias and/or smoothing filter unnecessary.

The filter of this invention solves, in its various embodiments, the technical problem and affords a number of advantages, outstanding among which is the fact that, for the same area of the integrated circuit, a much higher time constant $|G|+1$ can be achieved.

From another point of view, it may be considered that, to achieve a given time constant, a $|G|+1$ times smaller capacitor can be used.

We claim:

1. An RC filter for low or very low frequency applications, characterized in that it comprises:

- a first resistor between a filter input and a filter output;
- a fixed gain amplifier having an inverting input, a non-inverting input, and an amplifier output, the inverting input being connected to said filter output and having said amplifier output fed back to the inverting input through a first capacitor;
- a second resistor is connected between the inputs of said fixed gain amplifier; and
- a second capacitor is connected between the non-inverting input and ground.

2. An RC filter according to claim 1, characterized in that said fixed-gain amplifier is a differential cell operational type amplifier.

3. An RC filter according to claim 1, characterized in that said amplifier, said first and second resistors and said first and second capacitors are implemented in a single integrated circuit.

4. An RC filter according to claim 1, characterized in that said fixed-gain amplifier is implemented in the bipolar/MOS mixed technology with said comprising bipolar transistors and signal inputs provided through corresponding MOS transistors.

5. A lowpass filter having input and output terminals comprising:

a resistor coupled between the filter input and output terminals;

an amplifier, powered by a power supply, and having inverting and non-inverting input terminals and an output terminal and providing a negative gain therebetween, said inverting input terminal being coupled to the filter output terminal;

a first capacitor coupled between said amplifier output terminal and the filter output terminal;

a second capacitor coupled between said non-inverting input terminal and a circuit ground; and a first impedance element coupled between said inverting and non-inverting input terminals to provide additional filtering.

6. The filter of claim 5 wherein said fixed-gain amplifier is a differential cell type amplifier.

7. The filter of claim 5 wherein said amplifier, said resistor, said first and second capacitors, and said impedance element are implemented in a single integrated circuit.

8. The filter of claim 7, wherein said impedance element includes a resistor.

9. The filter of claim 5 wherein said impedance element includes a switched capacitor filter circuit acting as said impedance element.

10. The filter of claim 9 wherein said switched capacitor filter circuit comprises:

first and second MOS transistors series connected between said inverting and non-inverting input terminals; and a third capacitor coupled between said circuit ground and a circuit node between said first and second MOS transistors.

11. The filter of claim 5 wherein said differential amplifier comprises:

a differential stage having first and second differential transistors; and first and second input transistors, said first input transistor coupled to said first differential transistor and said second input transistor coupled to said second differential transistor.

12. The filter of claim 11 wherein said input transistors are MOS transistors.

13. The filter of claim 11 wherein said input transistors are MOS transistors and said differential transistors are bipolar transistors.

14. The filter of claim 5 wherein said impedance element includes a resistor.

15. The filter of claim 5 wherein said impedance element includes a transistor.

16. The filter of claim 5 wherein said impedance element includes a plurality of transistors and a capacitor functioning together as said impedance element.

17. An RC filter having a filter input and a filter output for low or very low frequency applications comprising:

a first resistor between the filter input and output;

a differential cell operational type amplifier with inverting and non-inverting inputs and having said inverting input connected to the filter output;

a first capacitor coupled between an amplifier output and the filter output;

a second resistor coupled between the inputs of said operational amplifier; and a second capacitor between said non-inverting input and ground.

18. The RC filter of claim 17 wherein said amplifier, said first and second resistors and said first and second capacitors are implemented in a single integrated circuit.

19. A lowpass filter formed in a semiconductor integrated circuit having filter input and output terminals, comprising:

a first impedance element coupled between the filter input and output terminals;

an amplifier, powered by a power supply, and having inverting and non-inverting input terminals and an output terminal and providing a negative gain therebetween, said inverting input terminal being coupled to the filter output terminal;

a first capacitor coupled between said amplifier output terminal and the filter output terminal;

a second capacitor coupled between said non-inverting input terminal and a circuit ground; and a second impedance element coupled between said inverting and non-inverting input terminals to provide additional filtering, each of said impedance elements, said capacitors, and said amplifier all being formed in the integrated circuit.

* * * * *

UNITED STATES PATENT AND TRADEMARK OFFICE
CERTIFICATE OF CORRECTION

PATENT NO. : 5,434,535
DATED : July 18, 1995
INVENTOR(S) : Luciano Tomasini et al.

It is certified that error appears in the above identified patent and that said Letters Patent is hereby corrected as shown below:

Item [73]
On the title page, under the heading "Assignee:", delete, "S.G.S. Thomson Microelectronics S.R.L." and insert therefor --SGS-Thomson Microelectronics, S.r.l.--.

Signed and Sealed this

Twenty-third Day of April, 1996

Attest:

BRUCE LEHMAN

*Attesting Officer* *Commissioner of Patents and Trademarks*